US009270282B2

(12) United States Patent
Portmann et al.

(10) Patent No.: US 9,270,282 B2
(45) Date of Patent: Feb. 23, 2016

(54) METHODS AND SYSTEMS FOR SWITCHING BETWEEN CLOCKS

(71) Applicant: Google Inc., Mountain View, CA (US)

(72) Inventors: Clemenz Portmann, Los Altos, CA (US); Donald Charles Stark, Palo Alto, CA (US)

(73) Assignee: Google Inc., Mountain View, CA (US)

( * ) Notice: Subject to any disclaimer, the term of this patent is extended or adjusted under 35 U.S.C. 154(b) by 83 days.

(21) Appl. No.: 14/138,506

(22) Filed: Dec. 23, 2013

(65) Prior Publication Data

US 2015/0180484 A1 Jun. 25, 2015

(51) Int. Cl.
*G06F 1/08* (2006.01)
*H03L 7/06* (2006.01)
*H03K 5/14* (2014.01)

(52) U.S. Cl.
CPC ... *H03L 7/06* (2013.01); *H03K 5/14* (2013.01)

(58) Field of Classification Search
CPC .................................................. G06F 1/08
USPC ................................................... 327/99
See application file for complete search history.

(56) References Cited

U.S. PATENT DOCUMENTS 5,604,452 A * 2/1997 Huang ........................... 327/99
5,790,609 A 8/1998 Swoboda
6,292,038 B1 * 9/2001 Stachura et al. .............. 327/145
6,429,698 B1 * 8/2002 Young ............................ 327/99
7,164,296 B2 1/2007 Biswurm et al.
7,893,748 B1 2/2011 Nekl
8,054,103 B1 * 11/2011 Janardhanan et al. .......... 326/93
2010/0001767 A1 * 1/2010 Shikata .......................... 327/99
2012/0127133 A1 5/2012 Frank
2013/0083611 A1 4/2013 Ware et al.

* cited by examiner

*Primary Examiner* — William Hernandez
(74) *Attorney, Agent, or Firm* — Morris & Kamlay LLP

(57) ABSTRACT

A clock signal for use by a circuit can be switched between clocks glitchlessly. A series of delay devices are connected in series based on an integral timing ratio. The integral timing ratio can be based on a ratio of the one of the clock's frequency or period to the other's frequency or period. When a clock select signal is received, the select signal is qualified and then delayed an amount of time based on the integral timing ratio, using the delay devices. The number of delay devices in each series can be the next largest integer to the integral timing ratio, plus one. The clock signal can then be glitchlessly switched from one clock to the other.

17 Claims, 5 Drawing Sheets

METHODS AND SYSTEMS FOR SWITCHING BETWEEN CLOCKS

BACKGROUND

A circuit can utilize a clock signal for purposes such as timing and synchronization. It can be useful to switch from one clock to another to change the frequency of the clock signal used by the circuit. The switchover from one clock to another be glitchless, meaning that the switchover shouldn't shorten any pulses and violate the timing of the blocks receiving the output clock.

BRIEF SUMMARY

According to implementations of the disclosed subject matter, a clock signal can be switched from a source clock to a target clock. An integral timing ratio can be determined between the source clock and the target clock. A first delay period can be determined based upon the integral timing ratio and the source clock period and a second delay period can be based upon the integral timing ratio and the target clock period. A clock switch signal can be received and a complement of the clock switch signal can be generated. The clock switch signal can be qualified relative to the source clock to produce a qualified source clock switch signal. The complement of the clock switch signal can be qualified relative to the target clock to produce a qualified target clock switch signal. The qualified source clock switch signal can be delayed for a first delay period equal to at least the product of the integral timing ratio and the source clock period to produce a delayed source clock switch signal. The qualified target clock switch signal can be delayed for a second delay period equal to the product of the integral timing ratio and the target clock period to produce a delayed target clock switch signal.

The integral timing ratio can be determined based on the source clock frequency and the target clock frequency or the source clock period and the target clock period. The larger of the source clock frequency and the target clock frequency can be a frequency numerator and the smaller of the source clock frequency and the target clock frequency can be a frequency denominator. The integral timing ratio can be based on the frequency numerator divided by the frequency denominator. Likewise, the larger of the source clock period and the target clock period can be a period numerator and the smaller of the source clock period and the target clock period can be a period denominator. The integral timing ratio can be based on the period numerator divided by the period denominator.

According to an implementation of the disclosed subject matter, a system can be provided having a first plurality of delay devices connected in series that can have a source clock input and a clock select input. A second plurality of delay devices connected in series can have a target clock input and an inverted clock select input. A first logic gate can have a first input for receiving a source clock select signal having a first delay and a second input for receiving a source clock select signal having a second delay. The second delay can be greater than the first delay. A second logic gate can have a third input for receiving a target clock select signal having a third delay and a fourth input for receiving a target clock select signal having a fourth delay. The fourth delay can be greater than the third delay. The logic gates can be AND gates. Any of the gates that can be AND gates can be any arrangement of any circuit components that conform to an AND logic table as known in the art.

The delay devices can include at least one flip-flop or latches. For example, two latches cascaded with complementary clocks can form a flip-flop. The system of claim 11, wherein the source clock input can receive a source clock signal having a source clock frequency and a source clock period. The target clock input can receive a target clock signal having a target clock frequency and a target clock period. The larger of the source clock frequency and the target clock frequency can be a frequency numerator. The smaller of the source clock frequency and the target clock frequency can be a frequency denominator. The larger of the source clock period and the target clock period can be a period numerator and the smaller of the source clock period and the target clock period can be a period denominator. The number of the first plurality of delay devices can be at least equal to one plus a nearest largest integer of the group consisting of: the frequency numerator divided by the frequency denominator or the period numerator divided by the period denominator. The number of the second plurality of delay devices can be the same as the number of the first plurality of delay devices.

A third logic gate can receive a source clock signal and a source clock deselect signal as inputs and produce a source clock signal as an output. A fourth logic gate can receive a target clock signal and a target clock select signal and produce a target clock signal as an output.

A fifth logic gate can receive as inputs the source clock signal and the target clock signal to produce a system clock signal as an output.

Systems and techniques according to the present disclosure allow for switching between clock domains with substantially zero system faults or glitches. Additional features, advantages, and implementations of the disclosed subject matter may be set forth or apparent from consideration of the following detailed description, drawings, and claims. Moreover, it is to be understood that both the foregoing summary and the following detailed description include examples and are intended to provide further explanation without limiting the scope of the claims.

BRIEF DESCRIPTION OF THE DRAWINGS

The accompanying drawings, which are included to provide a further understanding of the disclosed subject matter, are incorporated in and constitute a part of this specification. The drawings also illustrate implementations of the disclosed subject matter and together with the detailed description serve to explain the principles of implementations of the disclosed subject matter. No attempt is made to show structural details in more detail than may be necessary for a fundamental understanding of the disclosed subject matter and various ways in which it may be practiced.

DETAILED DESCRIPTION

In accordance with implementations of the disclosed subject matter, a circuit can switch from one clock to another without shortening pulses (without creating runt pulses) and violating the timing of the blocks receiving the output clock. An implementation can switch between two clock sources of different quality. The different quality clocks can be of the same frequency, but be of different phase. For example, an implementation can switch between a resistive-capacitive (RC) oscillator with tolerances of +/−30% and a crystal oscillator with accuracy of +/−50 ppm. Although an implementation may not shorten pulses, it may lengthen pulses. For example, an implementation can stretch low signals while preserving high signals or stretch high signals while preserving low signals.

Implementations of the disclosed subject matter may be used in circuits to switch clock signals to better manage use of power. For example, a processor, graphics board or communications circuit can operate at a higher clock speed during periods of high demand, thereby maintaining responsiveness and consuming more power. During idle periods, or periods of lower demand, the circuit can operate at a lower clock speed. An implementation of the disclosed subject matter can change clock speed for a circuit to manage the consumption of power in an efficient way. For example, an implementation can switch the clock speed of a timing signal used by a processor, graphics circuit or RF communications circuit in a smartphone or other device to conserve battery power or reduce overheating.

An implementation can detect a change in demand with respect to a given circuit. Upon detecting a change in state from higher to lower demand, the implementation can clock down the circuit by switching from a faster clock signal to a slower clock signal. Upon detecting a change in state from lower to higher demand, an implementation can clock up the circuit by switching from a slower clock signal to a faster clock signal. An implementation can switch clock signals based on a detected or otherwise determined temperature of the circuit. If a circuit temperature exceeds a temperature threshold, an implementation can clock down the circuit. If a circuit temperature falls below a threshold, an implementation can clock up the circuit.

Likewise, an implementation can switch from one clock signal originating from a first type of clock to another signal from another type of clock, even if both clocks operate at about the same rate. For example, a first clock (for example, based on a RC oscillator) may have a short startup time but use power less efficiently than a second clock (for example, based on a crystal oscillator) having a longer startup time but which uses power more efficiently. An implementation can switch the clock signal provided to a circuit from the rapid startup RC oscillator to the longer startup crystal signal, even if they operate at the same frequency.

Figure 1:
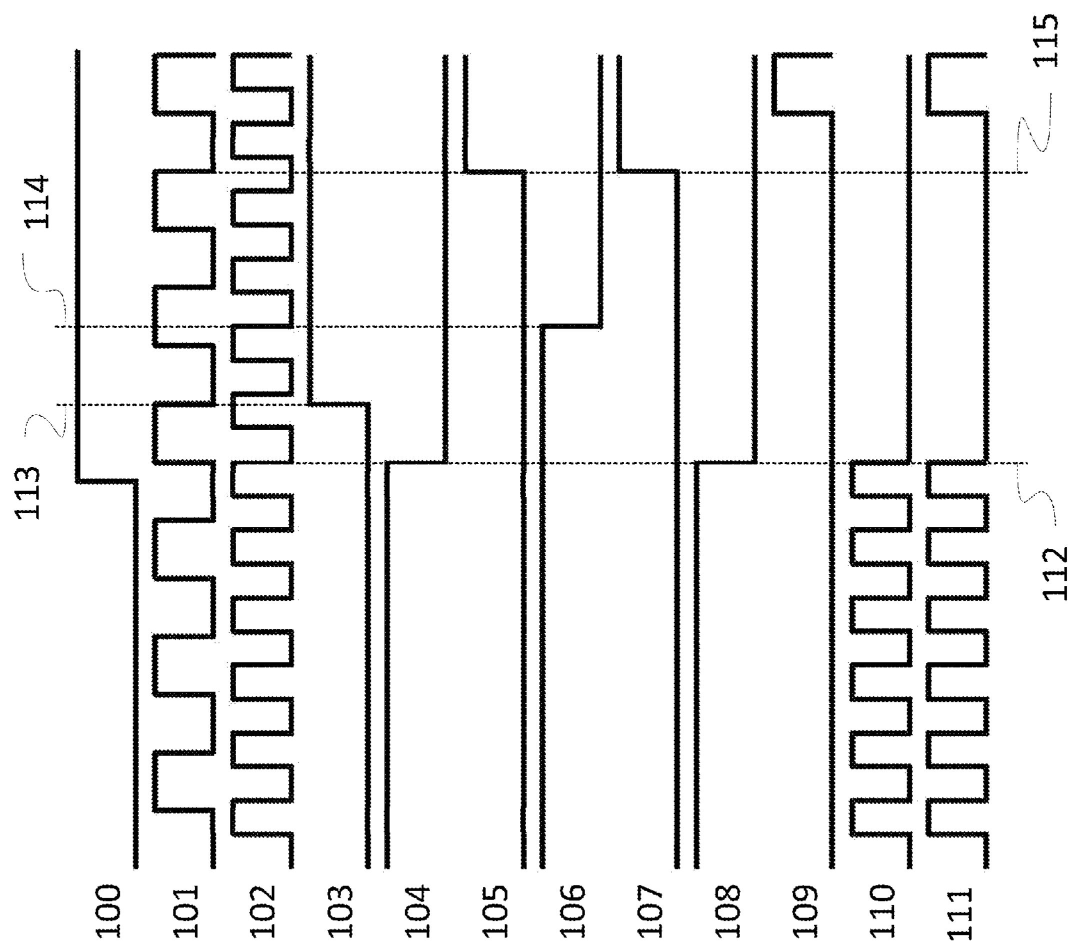
FIG. 1 shows a timing diagram according to an implementation of the disclosed subject matter.

As shown in FIG. 1, a clock select signal 100 (which can be synchronous or asynchronous) can be received in a system having two clock signals, a target clock signal 101 and a source clock signal 102. As used herein, the source clock signal is the signal presently being used by the system and the target clock signal is the clock signal to which the circuit is to switch. In accordance with the disclosed subject matter, an implementation can be glitchless. For example, at the time of the switchover, the source clock can have completed a whole period and the target clock can then provide a whole period.

The clock select signal 100 can indicate that the circuit is to switch from the source clock signal to the target clock signal (e.g., signified by a signal that changes from a low to a high state) or from the target clock signal to the source clock signal (e.g., signified by a signal that changes from a high to a low state), or vice versa. The clock select signal can be qualified in a clock domain by delaying the select signal 100 to the next rising or falling edge of the clock signal 101 or 102 in its respective domain. For example, signal 103 can be the clock select signal 100 qualified in the target clock domain because it has been delayed to the next falling edge of the target clock signal, 113. Signal 104 can be the clock select signal qualified in the source clock domain because it has been delayed to the next falling edge of the source clock, 112. In another implementation, the clock select signal can be qualified based on the next rising edges of the target and source clocks.

Signals 103 and 104 can be delayed to create signals 105 and 106. The magnitude of the delay can be determined by selecting the larger of the source clock frequency and the target clock frequency as a "frequency numerator," and the smaller of the source clock frequency and the target clock frequency as the "frequency denominator" and obtaining a timing ratio equal to the frequency numerator divided by the frequency denominator. Alternatively, the larger of the source clock period and the target clock period can be selected as the "period numerator," and the smaller of the source clock period and the target clock period can be selected as the "period denominator" and the timing ratio can be equal to the period numerator divided by the period denominator.

An integral timing ratio can be determined by selecting the nearest integer that is greater than the timing ratio. A clock switching circuit can be provided that includes a number of flip-flops equal to one plus the integral timing ratio. In an implementation, the flip-flops can be configured to cause a delay period equal to a product of the integral timing ratio and a period of a clock. For example, it can produce a delay period in the source clock domain equal to the integral timing ratio times the source clock period, and a delay period in the target clock domain equal to the integral timing ratio times the target clock period. Thus, signal 105 can be based on delaying signal 103 an amount equal to the integral timing ratio times the period of the target clock. Signal 106 can be based on delaying signal 104 an amount equal to the integral timing ratio times the period of the source clock. In an implementation, a delay device can include two latches, which when cascaded with complementary clocks can form a flip-flop In an implementation, signals 103 and 105 can be input to a logic gate such as an AND gate, producing signal 107. Signals 104 and 106 can be input to a logic gate (e.g., an AND gate) to produce signal 108. Signal 108 can deselect the source clock (shown as signal 110) at 112 and signal 107 can select the target clock (shown as signal 109) at 115. The system can thus glitchlessly switch from the source to the target clock as shown by signal 111. An implementation can use any suitable arrangement of hardware that produces these results, such as an XOR gate or other arrangements that produce the appropriate truth table.

Figure 2:
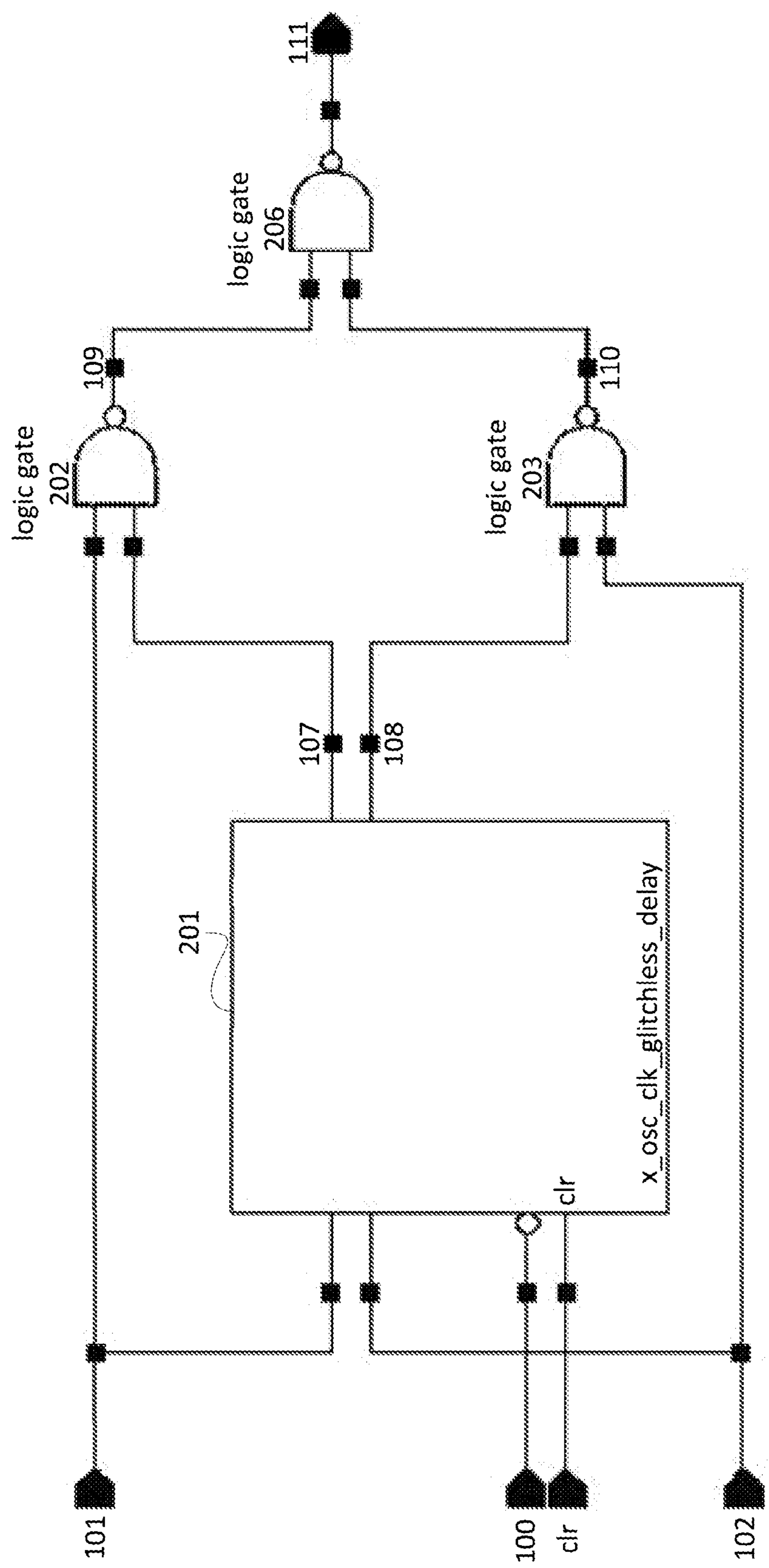
FIG. 2 shows a first system according to an implementation of the disclosed subject matter.
Figure 3:
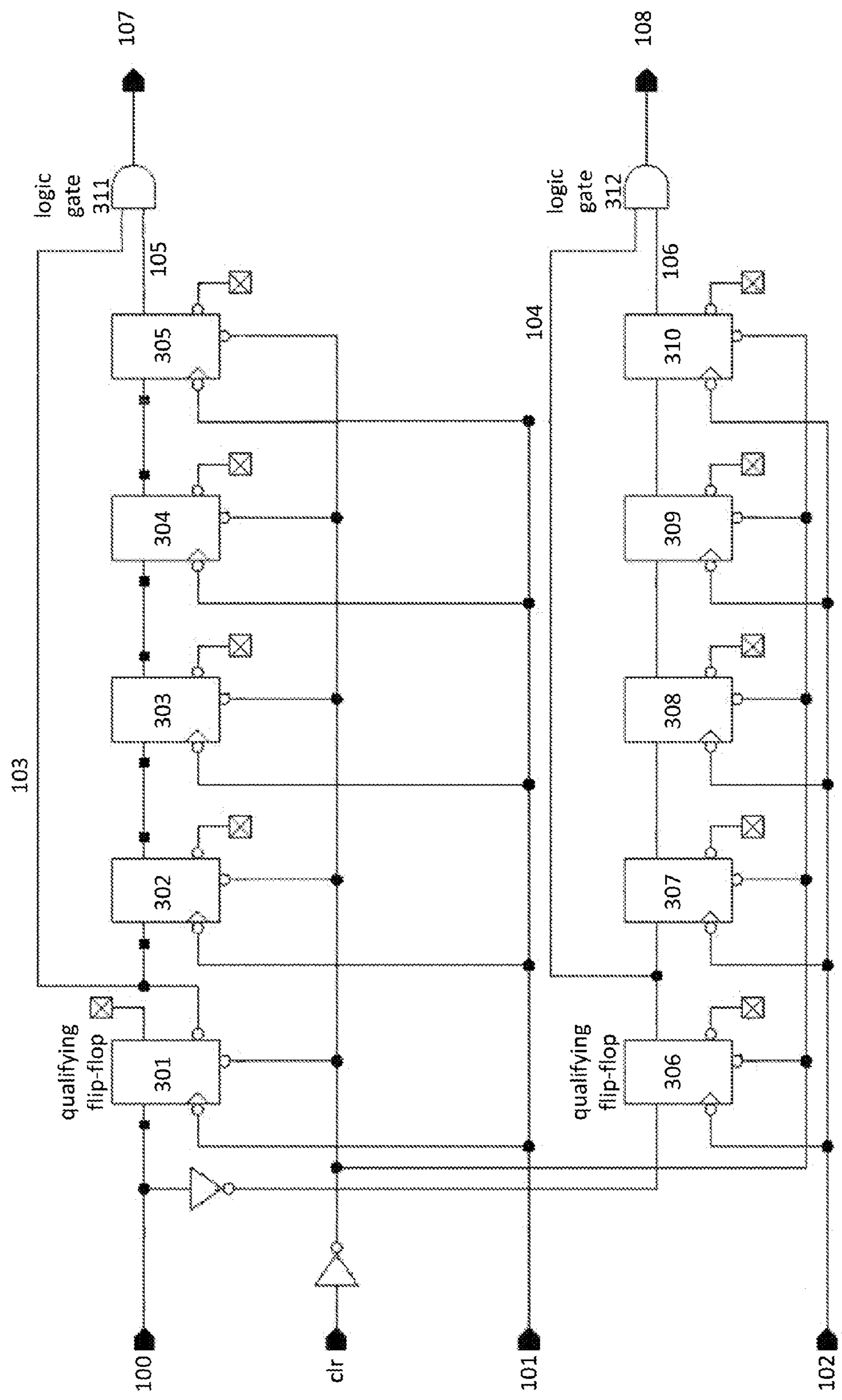
FIG. 3 shows a second system according to an implementation of the disclosed subject matter.

As shown in FIG. 2, an implementation can receive a clock select signal 100, a target clock signal 101 and a source clock signal 102. The implementation can use flip-flops and/or latches and logic gates (for example, as shown in FIG. 3) to produce signals 107 and 108. Signal 107 can be input along with target clock signal 101 to logic gate 202 (such as an AND gate) to produce signal 109. Signal 108 can be input along with source clock signal 102 to AND gate 203 to produce signal 107. The output signals 109 and 110 can be input into logic gate (such as an XOR gate or an OR gate) 206 to produce glitchless clock signal 111.

A configuration shown as 201 in FIG. 2 is shown in FIG. 3 in accordance with an implementation of the disclosed subject matter. The target clock signal 101 along with clock select signal 100 is fed to a top series of flip flops 301-305 and the source clock signal 102 is fed along with the complement of the clock select signal to a bottom series of flip flops 306-310. In an implementation, a delay device can include two latches, which when cascaded with complementary clocks can form a flip-flop. Flip flop 301 qualifies clock select signal 100 to produce signal 103, while flip flop 306 qualifies the complement of clock select signal 101 to produce signal 104. Each flip flop after 301 delays signal 103 by one period of the target clock, while each flip flop after 306 delays signal 104 by one period of the source clock. Signal 105 is input to logic gate 311 with 103 to produce signal 107, and signal 106 is input to logic gate 312 with signal 104 to produce signal 108.

Figure 4:
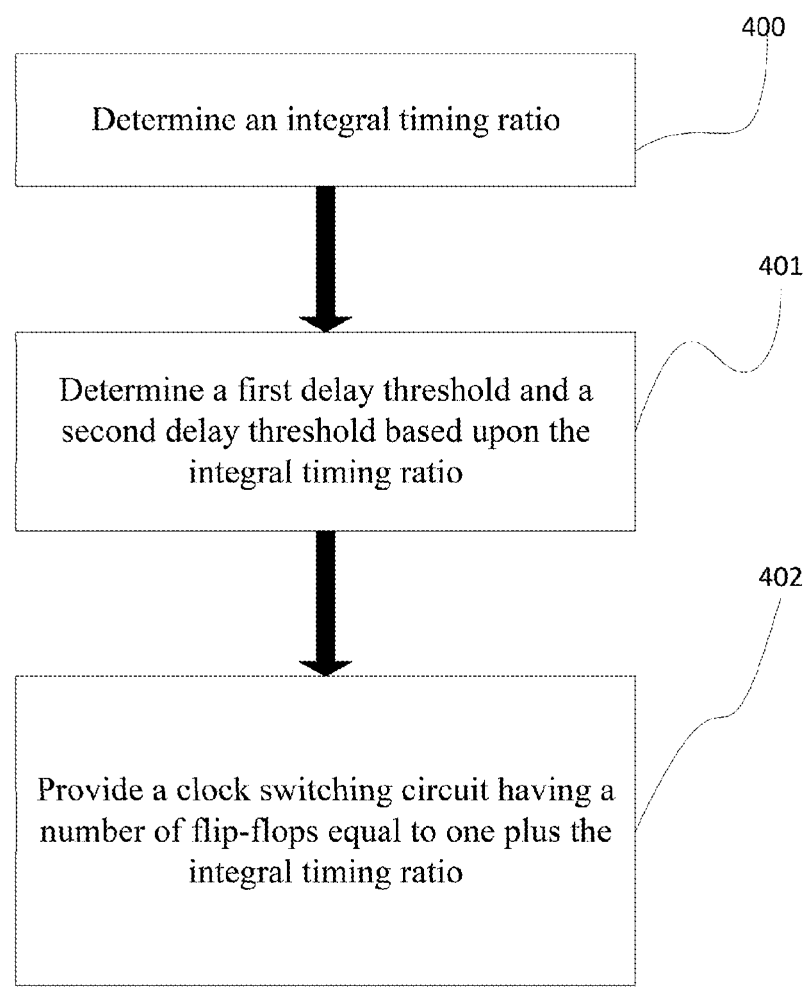
FIG. 4 shows a method flow chart according to an implementation of the disclosed subject matter.

An implementation of the disclosed subject matter can provide a glitchless clock signal that switches from a source clock signal to a target clock signal. As shown in FIG. 4, an integral timing ratio between the source clock and a target clock can be determined, 400. A source clock delay threshold and a target delay threshold can be determined based upon the integral timing ratio, 401. A clock switching circuit can be provided that comprises a number of flip-flops equal to one plus the integral timing ratio, 402. In an implementation, a delay devices can include two latches, which when cascaded with complementary clocks can form a flip-flop. The flip-flops can be configured to cause a switching delay period between the source and target delay thresholds. The source delay threshold can be at least equal to the product of the integral timing ratio and a target clock period and the target delay threshold can be not more than the product of the integral timing ratio plus one and a target clock period.

The integral timing ratio can be based on a ratio of a source clock frequency to a target clock frequency or a ratio of a source clock period to a target clock period. The integral timing ratio can be determined by designating a the larger of the source clock frequency and the target clock frequency to be a frequency numerator and the smaller of the source clock frequency and the target clock frequency to be a frequency denominator. Alternatively, the larger of the source clock period and the target clock period can be a period numerator and the smaller of the source clock period and the target clock period can be a period denominator. The integral timing ratio can be the nearest higher integer to either a frequency ratio based on the frequency numerator divided by the frequency denominator or the period numerator divided by the period denominator.

In accordance with the disclosed subject matter, the source clock may have a higher frequency than the target clock or vice versa.

Figure 5:
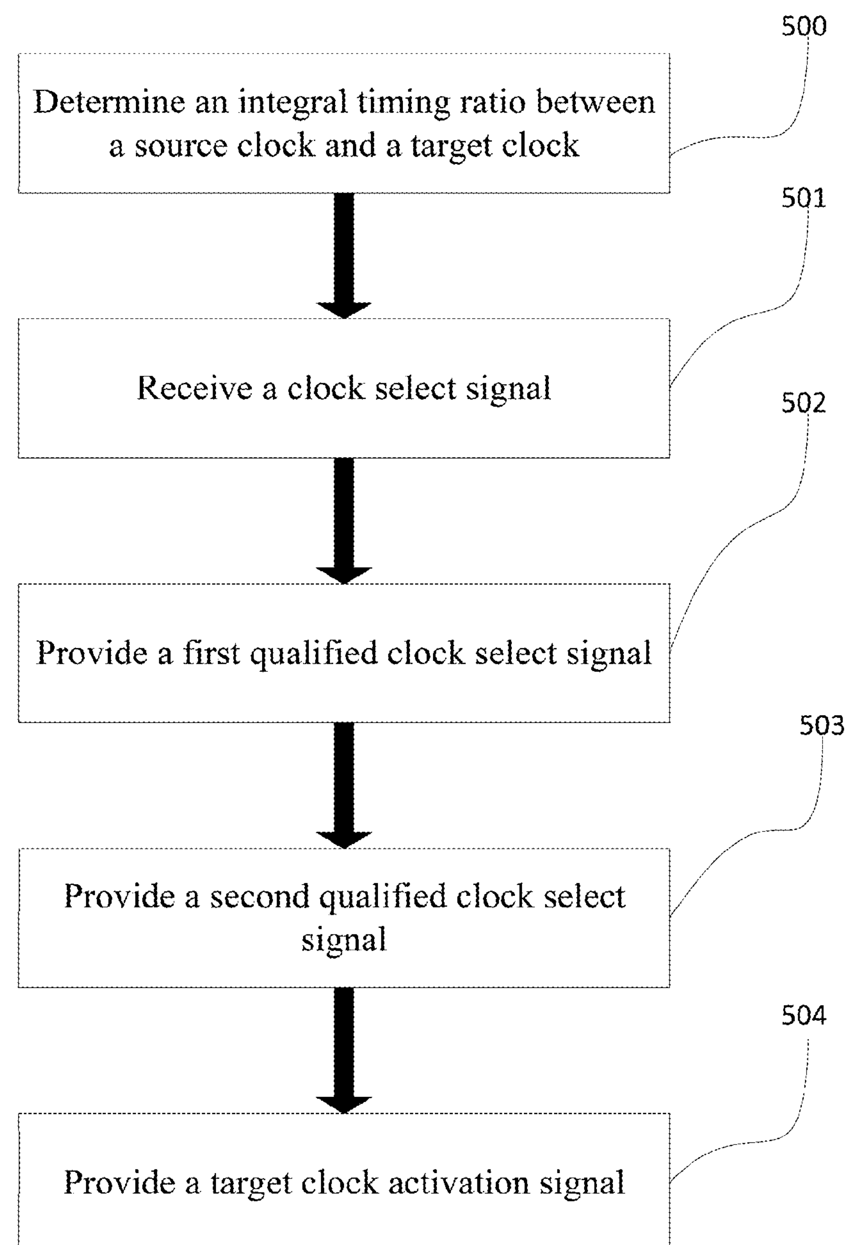
FIG. 5 shows a method flow chart according to an implementation of the disclosed subject matter.

As shown in FIG. 5, an implementation can determine an integral timing ratio between a source clock and a target clock, 500, and receive a clock select signal, 501. It can provide a source clock qualified clock select signal, 502, at a next edge of the edge type of a given edge type (e.g., rising edge or falling edge) of the source clock and provide a target clock qualified clock select signal, 503, at a next edge of the edge type of the target clock. It can provide a target clock activation signal, 504, at a time period after the first qualified clock select signal. The time period can be equal to or greater than at the product of the integral timing ratio and the period of the target clock.

The implementation can also provide a source clock deactivation signal at the second qualified clock select signal.

An implementation can include a number of delay devices (such as flip-flops and/or latches) connected in series. One series of delay devices can have a source clock signal 102 input and a clock select signal 100 input. Another series of delay devices can have a target clock signal 101 input and a complement clock select signal input. The complement clock select signal can be generated by passing the clock select signal 100 through an inverter.

A logic gate 311 can have an input for receiving a qualified source clock select signal 103 and another input for receiving a delayed source clock select signal 105. Logic gate 311 can output signal 107. Another logic gate 312 can have an input for receiving a qualified target clock select signal 104 another input for receiving a delayed target clock select signal 106. An output of logic gate 312 can be signal 108. These logic gates can be AND gates.

An implementation can include a source clock input for receiving a source clock signal having a source clock frequency and a source clock period, as well as a target clock input that for receiving a target clock signal having a target clock frequency and a target clock period. The larger of the source clock frequency and the target clock frequency can be a frequency numerator and the smaller of the source clock frequency and the target clock frequency can be a frequency denominator. Also, the larger of the source clock period and the target clock period can be a period numerator and the smaller of the source clock period and the target clock period can be a period denominator.

The number of delay devices in a series can be equal to a nearest largest integer to a frequency ratio based on the frequency numerator divided by the frequency denominator, or a period ratio based on the period numerator divided by the period denominator, plus one.

A logic gate 202 can have signals 107 and 101 as inputs to produce signal 109 as an output. Another logic gate 203 can have signals 108 and 102 as inputs to produce signal 110 as an output. Logic gates 202 and 203 can be AND gates. Signals 109 and 110 can be inputs to logic gate 206 (such as an XOR gate or an OR gate) to produce output signal 111.

The foregoing description, for purpose of explanation, has been described with reference to specific implementations. However, the illustrative discussions above are not intended to be exhaustive or to limit implementations of the disclosed subject matter to the precise forms disclosed. Many modifications and variations are possible in view of the above teachings. The implementations were chosen and described in order to explain the principles of implementations of the disclosed subject matter and their practical applications, to thereby enable others skilled in the art to utilize those implementations as well as various implementations with various modifications as may be suited to the particular use contemplated.

The invention claimed is:

1. A method comprising:

determining an integral timing ratio;

determining a first delay period based upon the integral timing ratio and a source clock period;

determining a second delay period based upon the integral timing ratio and a target clock period;

receiving a clock switch signal;

generating a complement of the clock switch signal;

qualifying the clock switch signal relative to a source clock to produce a qualified source clock switch signal;

qualifying the complement of the clock switch signal relative to a target clock to produce a qualified target clock switch signal;

delaying the qualified source clock switch signal a first delay period equal to at least the product of the integral timing ratio and the source clock period to produce a delayed source clock switch signal; and delaying the qualified target clock switch signal a second delay period equal to the product of the integral timing ratio and the target clock period to produce a delayed target clock switch signal.

2. The method of claim 1, further comprising performing a logical operation on the delayed source clock switch signal with the qualified source clock switch signal.

3. The method of claim 1, further comprising performing a logical operation on the delayed target clock switch signal with the qualified target clock switch signal.

4. The method of claim 1, further comprising:

performing a logical operation on the delayed source clock switch signal with the qualified source clock switch signal to produce a source clock deselect signal;

performing a logical operation on the delayed target clock switch signal with the qualified target clock switch signal to produce a target clock select signal;

performing a logical operation on the source clock deselect signal with the source clock signal to produce a source clock output signal; and performing a logical operation on the target clock select signal with the target clock signal to produce a target clock output signal.

5. The method of claim 4, wherein the logical operation is an AND operation.

6. The method of claim 4, further comprising performing a logical operation on the source clock output signal and the target clock output signal to produce a glitchless transition from the source clock signal to the target clock signal.

7. The method of claim 6, wherein the logical operation is an AND operation.

8. The method of claim 1, wherein the integral timing ratio is based on a ratio of a source clock frequency to a target clock frequency.

9. The method of claim 1, wherein the integral timing ratio is based on a ratio of a source clock period to a target clock period.

10. The method of claim 1, wherein the source clock has a source clock frequency and a source clock period and the target clock has a target clock frequency and a target clock period, the larger of the source clock frequency and the target clock frequency being a frequency numerator and the smaller of the source clock frequency and the target clock frequency being a frequency denominator, the larger of the source clock period and the target clock period being a period numerator and the smaller of the source clock period and the target clock period being a period denominator; and determining the integral timing ratio comprises determining a nearest largest integer of at least one selected from the group consisting of: a frequency ratio based on the frequency numerator divided by the frequency denominator, and a period ratio based on the period numerator divided by the period denominator.

11. A system, comprising:

a first plurality of delay devices connected in series having a source clock input and a clock select input;

a second plurality of delay devices connected in series having a target clock input and an inverted clock select input;

a first logic gate having a first input for receiving a source clock select signal having a first delay and a second input for receiving a source clock select signal having a second delay, the second delay being greater than the first delay; and a second logic gate having a third input for receiving a target clock select signal having a third delay and a fourth input for receiving a target clock select signal having a fourth delay, the fourth delay being greater than the third delay.

12. The system of claim 11, wherein the first logic gate and the second logic gate are AND gates.

13. The system of claim 11, wherein the first and second plurality of delay devices includes at least one from the group consisting of: a flip-flop and a latch.

14. The system of claim 11, wherein the source clock input receives a source clock signal having a source clock frequency and a source clock period and the target clock input receives a target clock signal having a target clock frequency and a target clock period, the larger of the source clock frequency and the target clock frequency being a frequency numerator and the smaller of the source clock frequency and the target clock frequency being a frequency denominator, the larger of the source clock period and the target clock period being a period numerator and the smaller of the source clock period and the target clock period being a period denominator; and wherein the number of the first plurality of delay devices is equal to one plus a nearest largest integer of at least one selected from the group consisting of: the frequency numerator divided by the frequency denominator, and the period numerator divided by the period denominator.

15. The system of claim 11, wherein the source clock input receives a source clock signal having a source clock frequency and a source clock period and the target clock input receives a target clock signal having a target clock frequency and a target clock period, the larger of the source clock frequency and the target clock frequency being a frequency numerator and the smaller of the source clock frequency and the target clock frequency being a frequency denominator, the larger of the source clock period and the target clock period being a period numerator and the smaller of the source clock period and the target clock period being a period denominator; and wherein the number of the second plurality of delay devices is equal to one plus a nearest largest integer of at least one selected from the group consisting of: the frequency numerator divided by the frequency denominator, and the period numerator divided by the period denominator.

16. The system of claim 11, further comprising:

a third logic gate having a fifth input for receiving a source clock signal and a sixth input for receiving a source clock deselect signal to produce a glitchless source clock signal; and a fourth logic gate having a seventh input for receiving a target clock signal and an eighth input for receiving a target clock select signal to produce a glitchless target clock signal.

17. The system of claim 16, further comprising a fifth logic gate having a ninth input for receiving the glitchless source clock signal and a tenth input for receiving the glitchless target clock signal to produce a glitchless system clock signal.

* * * * *